United States Patent
Rajh et al.

(10) Patent No.: US 6,410,935 B1
(45) Date of Patent: Jun. 25, 2002

(54) SEMICONDUCTOR ASSISTED METAL DEPOSITION FOR NANOLITHOGRAPHY APPLICATIONS

(75) Inventors: Tijana Rajh, Naperville; Natalia Meshkov, Downers Grove, both of IL (US); Jovan M. Nedeljkovic, Belgrade (YU); Laura R. Skubal, West Brooklyn, IL (US); David M. Tiede, Elmhurst, IL (US); Marion Thurnauer, Downers Grove, IL (US)

(73) Assignee: Argonne National Laboratory, Argonne, IL (US)

( * ) Notice: Subject to any disclaimer, the term of this patent is extended or adjusted under 35 U.S.C. 154(b) by 0 days.

(21) Appl. No.: 09/858,791

(22) Filed: May 16, 2001

Related U.S. Application Data

(62) Division of application No. 09/200,159, filed on Nov. 25, 1998, now Pat. No. 6,271,130.

(51) Int. Cl.[7] .............................................. H01L 29/12
(52) U.S. Cl. .............................. 257/43; 257/9; 257/642; 257/746; 257/752; 257/762; 438/676; 438/677
(58) Field of Search .......................... 257/43, 752, 753, 257/762, 763, 764, 746, 642, 643, 528, 9, 30, 37; 438/676, 677

(56) References Cited

U.S. PATENT DOCUMENTS

| 5,405,656 A | * | 4/1995 | Ishikawa et al. ............. 427/500 |
| 5,422,907 A | * | 6/1995 | Bhargava ...................... 372/68 |
| 5,906,670 A | * | 5/1999 | Dobson et al. ................ 75/370 |

OTHER PUBLICATIONS

Rajh, et al., "Reactions of Hydrous Titanium Oxide Colloids with Strong Oxidizing Agents," Langmuir, 1992, vol. 8, pp. 1265–1270.

Saponjic, et al., "Characterization of the Contact Between TiO2 and PbS Quantum Dots," IEEE, 1995, pp. 157–160.

* cited by examiner

*Primary Examiner*—Nathan Flynn
*Assistant Examiner*—Remmon R. Fordé
(74) *Attorney, Agent, or Firm*—Foley & Lardner

(57) ABSTRACT

An article of manufacture and method of forming nanoparticle sized material components. A semiconductor oxide substrate includes nanoparticles of semiconductor oxide. A modifier is deposited onto the nanoparticles, and a source of metal ions are deposited in association with the semiconductor and the modifier, the modifier enabling electronic hole scavenging and chelation of the metal ions. The metal ions and modifier are illuminated to cause reduction of the metal ions to metal onto the semiconductor nanoparticles.

15 Claims, 12 Drawing Sheets

SEMICONDUCTOR ASSISTED METAL DEPOSITION FOR NANOLITHOGRAPHY APPLICATIONS

This application is a divisional of application Ser. No. 09/200,159, filed Nov. 25, 1998, Now U.S. Pat. No. 6,271,130.

This invention was made with Government support under Contract No. W-31-109-ENG-38 awarded by the Department of Energy. The Government has certain rights in this invention.

This invention relates to a method of semiconductor assisted metal deposition and article of manufacture for nanolithography applications, especially where the formation of metal patterns of high resolution is important, such as in the electronics industry. More particularly, the invention relates to a method for forming a metallic deposit in a precise pattern on a semiconductor, such as titanium dioxide, by use of a surface modifier deposited on the semiconductor. Preferably, the semiconductor is of nanoparticle size, and the modifier is selected to provide both a hole (in the electronic sense) scavenging and chelating effect. The metal is applied in the form of ions which are subsequently reduced by a photocatalytic action. Preferably, the metal is copper, silver, or gold.

The electronics industry has made considerable progress in its efforts to miniaturize electronic components for purposes of creating much smaller products for use, for improving performance and also for reducing power consumption requirements. Since the development of integrated circuits, there has been a need to reduce the size of all electronic components, including conductor interconnects, capacitors, inductors and other such components. Currently, the available technology cannot easily establish dimensions for electronic components less than about 100 nm–200 nm. Such dimensional limitations are preventing further progress in electronic device performance and general miniaturization needs.

It is therefore an object of the invention to provide an improved method and article of manufacture of ultra-fine dimensioned electronic components.

It is another object of the invention to provide a novel method and article of manufacture of ultra-fine dimensioned metallic conductor components.

It is a further object of the invention to provide an improved method and article of manufacture of nanoparticles of a semiconductor having metals deposited thereon.

It is yet another object of the invention to provide a novel method and article of manufacture of semiconductor oxide treated by a bidentate liquid to enable controlled deposition of metals on the semiconductor oxide. It is still an additional object of the invention to provide an improved method and article of manufacture of semiconductor oxide of nanoparticle size treated to create metal deposition sites activated by a source of light energy.

It is also a further object of the invention to provide a novel method and article of manufacture for reducing metal ions by photocatalytic activation to deposit metal onto a semiconductor base.

It is yet another object of the invention to provide an improved method and article of manufacture for reducing metal ions by a scanning tunneling microscope to deposit metal onto a semiconductor base.

SUMMARY OF THE INVENTION

Photocatalytic reactions on surfaces have been found to be very important in various applications, such as environmental cleanup and remediation. Examples include oxidation of organic materials and reduction of heavy metal ions in industrial waste streams. In the case of using a $TiO_2$ material, $TiO_2$ nanoparticles are expected to have unique surface chemistry due to their larger surface area. Photoirradiation of $TiO_2$ nanoparticles with photo energy larger than the bandgap (3.2 eV) creates electron-hole pairs. Following irradiation, the $TiO_2$ nanoparticles act as either electron or hole donors to reduce or oxidize materials, respectively, in the surrounding media. However, the photo-induced charge separation in bare $TiO_2$ nanoparticles has a very short lifetime because of charge recombination. It is therefore important to prevent electron-hole recombination before a designated redox reaction occurs.

In one embodiment of the present invention the use of selected nanoparticles of semiconductors can be manipulated to control photo-induced charge separations and enhance metal ion deposition to create desirable electronic components. For example, a layer of a semiconductor, such as $TiO_2$ in the nanoparticle size regime of about 45A, is deposited on a glass or other support. To the semiconductor component is added a modifier, such as a bidentate ligand (alanine), to provide both hole scavenging and a chelating effect in order to prevent rapid electron-hole recombination. Further, simultaneously or subsequently with adding the ligand, a source of conductive metal ions, such as copper, silver, or gold, is added to the modified surface of the titanium dioxide. The surface is activated by directing a source of light energy onto the modified surface with metal ions to reduce the metal ions to form elemental metal in the desired electronic pattern on the semiconductor base. With a general source of light energy, a mask will typically be necessary to form the desired pattern of metal. However, when a laser or a source of synchrotron X-rays used as a photon source, no mask is needed; the pattern is produced by moving the sample relative to a stationary light source by a stepper motor, for example. Preferably, the pattern is produced by using a scanning tunneling microscope (STM).

One area of potential use of the invention is in the production of miniature sized circuit elements with patterns of conductive metal of relatively high resolution. These patterns can be arranged with or without other material layers to construct many types of electronic components, such as CMOS devices. The high resolution of such patterns results from the selection of a semiconductor with a particle size in the range of 20–70 A. Such a semiconductor process is, for example, useful for producing miniature circuit elements of copper on silicon wafers or other semiconductors.

While the semiconductor oxides of the preferred embodiment differ from the silicon composition of more typical semiconductors, such as Si, it is believed that the invention provides a method of forming metal patterns of high resolution on a semiconductor base and that specific advantages of the invention for electronic products result.

Accordingly, the invention can be described as a semiconductor assisted metal deposition for nanolithography applications and resulting products, such as integrated circuit components. The semiconductor preferably is titanium dioxide, although it can include many other semiconductor materials, such as tungsten dioxide, vanadium dioxide, and doped compositions from these materials. In the method, a film of the semiconductor is formed on a substrate or glass or other conventional material. Preferably, the semiconductor is of nanosize particles with essentially uniform particle sizes in the order of 20–70 A diameter. A modifier, which is preferably bidentate ligand (alanine), is applied to titanium dioxide to provide a surface with enhanced activity as initiated by the application of light or other energy. Other modifiers can include selected compositions based on aminophosphoric acids, glycine, lucine, and the like. Simultaneously or subsequently, a source of metal ions, such as, copper, silver, or gold is applied to the modified surface of the semiconductor. A source of energy (such as light) is then applied to activate the metal ion reduction to form the desired conductive pattern. When using a conventional light source, a mask will typically be necessary to form the desired pattern. Preferably, the pattern is formed by the use of a scanning tunneling microscope (STM) which is capable of forming the pattern with high resolution. Alternatively, a laser or an X-ray beam can be used as a light source. The use of a semiconducting small particle size is important in producing the metallic patterns with fine resolution when using X-rays or STM for catalytic deposition.

These features and other objects and advantages of the invention will be described in detail in the description provided hereinafter taken in conjunction with the drawings described below.

DETAILED DESCRIPTION OF THE PREFERRED EMBODIMENTS

Figure 1A:
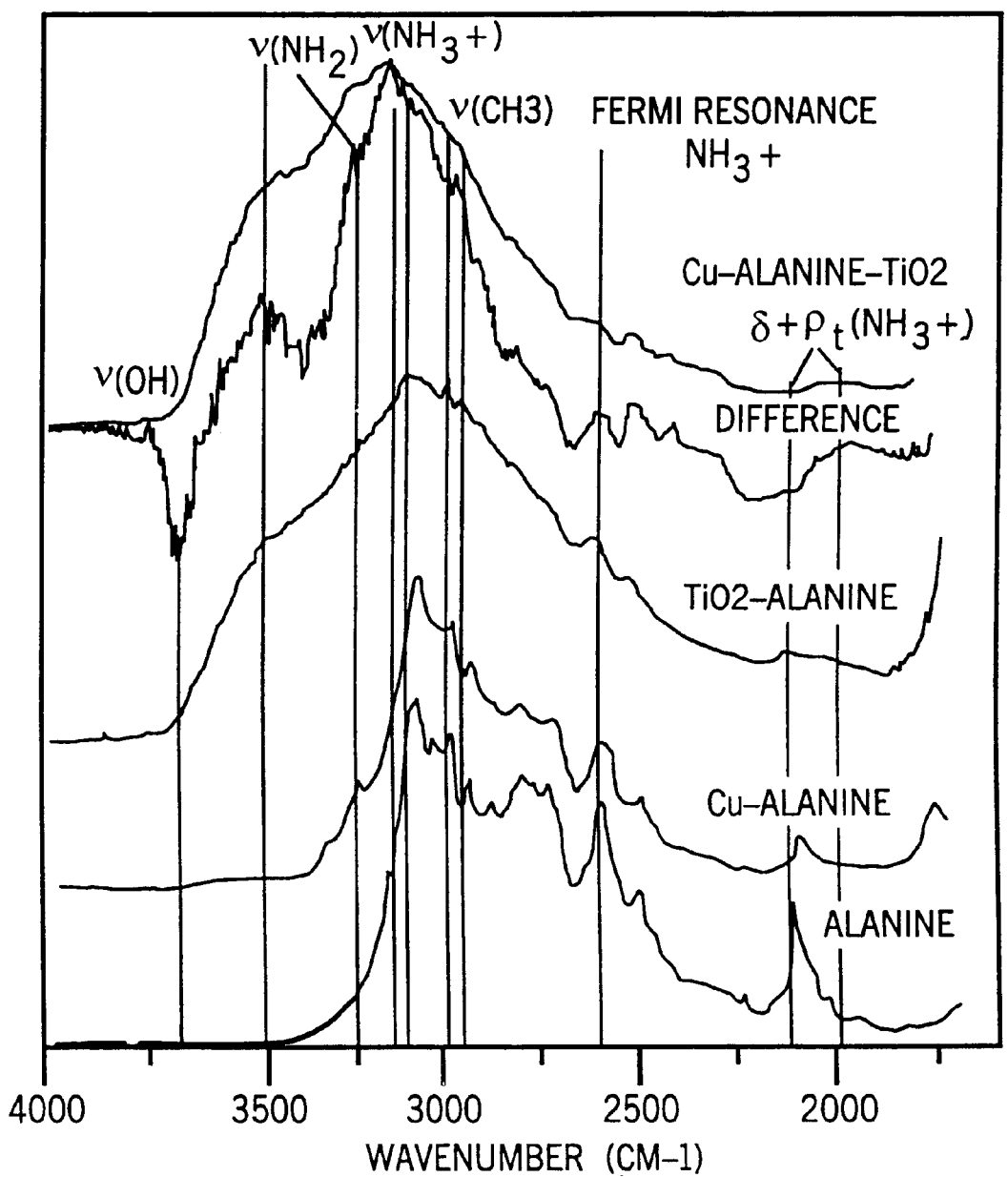
FIG. 1 shows segments of infrared spectra of $TiO_2$ (45A) colloids modified with alanine and in the presence of copper ions; the infrared spectra of alanine and copper/alanine complexes are also shown;.

In a preferred embodiment of the invention, an oxide semiconductor can be prepared as a nanoparticulate which undergoes photocatalytic reduction of metal ions deposited on the semiconductor. The metal ions are reduced by assistance of multifunctional ligands which bind to a colloidal form of the semiconductor surface and to the metal ions. This enhances adsorption of metal ions at the nanoparticle surface, and at the same time, acts to chelate photoproduced metal ions. Illumination of oxide semiconductors, such as $TiO_2$, with light energy greater than the band gap (3.2 eV in $TiO_2$) generates electron hole pairs that can migrate to the surface of the nanoparticle and participate in the reduction and oxidation processes with dissolved species. Due to the short lifetime of charge carriers, one or both charge carriers formed during illumination have to be removed from the nanoparticle before they recombine. This can be achieved only in fast reactions with adsorbed species, as charge pair recombination in particulate semiconductors occurs in a picosecond time regime (no band bending). The large surface area of colloidal $TiO_2$, having a nanoparticle size in the nanometer regime, results in a large amount of adsorbed species relative to the bulk and consequently to higher efficiencies of photocatalytic reactions. However, concomitantly, in these nanoparticle colloids a large fraction of atoms are coordinated with solvent molecules which decrease the bond energies at the surface and act as trapping sites for photogenerated charges. This results in reduced redox properties of photogenerated charges relative to the conduction and valence band charges. The multi-functional ligands assist in overcoming this detriment enabling the redox reaction to proceed efficiently.

In another aspect of the invention, the deposition of the metal onto the semiconductor can be accomplished by employing a scanning tunneling microscope (STM). By applying an electric potential difference between the STM tip and the semiconductor, electrons will be injected into the conduction band of the semiconductor colloid. These electrons will then become available for metal ion reduction enabling metal deposition on the nanoparticles of semiconductor.

The colloidal semiconductor particle, preferably a metal oxide, such as $TiO_2$ can be prepared with a mean particle diameter of 45 A and were prepared by controlled hydrolysis. In the case of $TiO_2$ this was done using titanium (IV) chloride, as described in detail in Example I set forth hereinafter. Particle size was determined by use of conventional transmission electron microscope. The concentration of $TiO_2$ (0.1–0.6M) was determined from the concentration of the peroxide complex obtained after dissolving the colloid in concentrated $H_2SO_4$ (II).

The nanocrystalline $TiO_2$ films were generally prepared on glass supports by a dip coating technique using $TiO_2$ (45 A) colloids as a precursor. After dipping the glass slides in the concentrated $TiO_2$ colloidal solution (0.12 M), the samples were dried at elevated temperature (150° C.) for 30 min. Typically, the above mentioned procedure was repeated from 3 to 7 times. Thickness of $TiO_2$ films was determined in a conventional manner from the position of interference fringes in light transmission spectra A linear dependence between the film thickness and number of depositions was found with the increase of film thickness of about 80 nm per each deposition. Also, the thickness of a nanocrystalline $TiO_2$ films was fairly uniform across the film.

The surface modification of nanocrystalline $TiO_2$ films can be accomplished by immersion of the samples in water solution containing 0.1 M alanine and 0.05 M $AgNO_3$ for>24 h. The samples were then rinsed with distilled water and dried in a stream of nitrogen. Further details of sample preparation are set forth in Example I.

As mentioned hereinbefore, in order to improve performance of nanocrystalline $TiO_2$ films for photocatalytic deposition of metals, the multifunctional ligand (alanine) was used as a surface modifier to control hole/electron recombination and enhance metal ion adsorption. Based on FTIR measurements, it is proposed that the addition of carboxylic acids results in the replacement of $TiO_2$ surface OH groups and coordination of surface Ti atoms with a carboxyl group. Consequently, the adsorption of metal ions to surface modified $TiO_2$ particles is increased. Similar results of enhanced adsorption of metal ions onto other oxide semiconductors can be achieved by use of other modifiers acting in a known manner to enhance adsorption.

In one form of the invention, different complexing agents were used in order to complex Cu ions and enhance the formation of metallic Cu. The surface of a colloidal oxide semiconductor, such as $TiO_2$, was modified with ligands that preferably have the phosphono, carboxyl, and amino groups (alanine, glycine, and APPA). In a preferred embodiment, the criteria for selecting surface modifiers for the effective reduction of metal ions are that the modifier is:

1. An electron donating species.
2. A strong adsorber, preferentially forms a charge transfer complex with the semiconductor oxide.
3. Adsorbs dissolved metal ions.
4. Modifies redox properties of semiconductor oxide particles.

Figure 1:
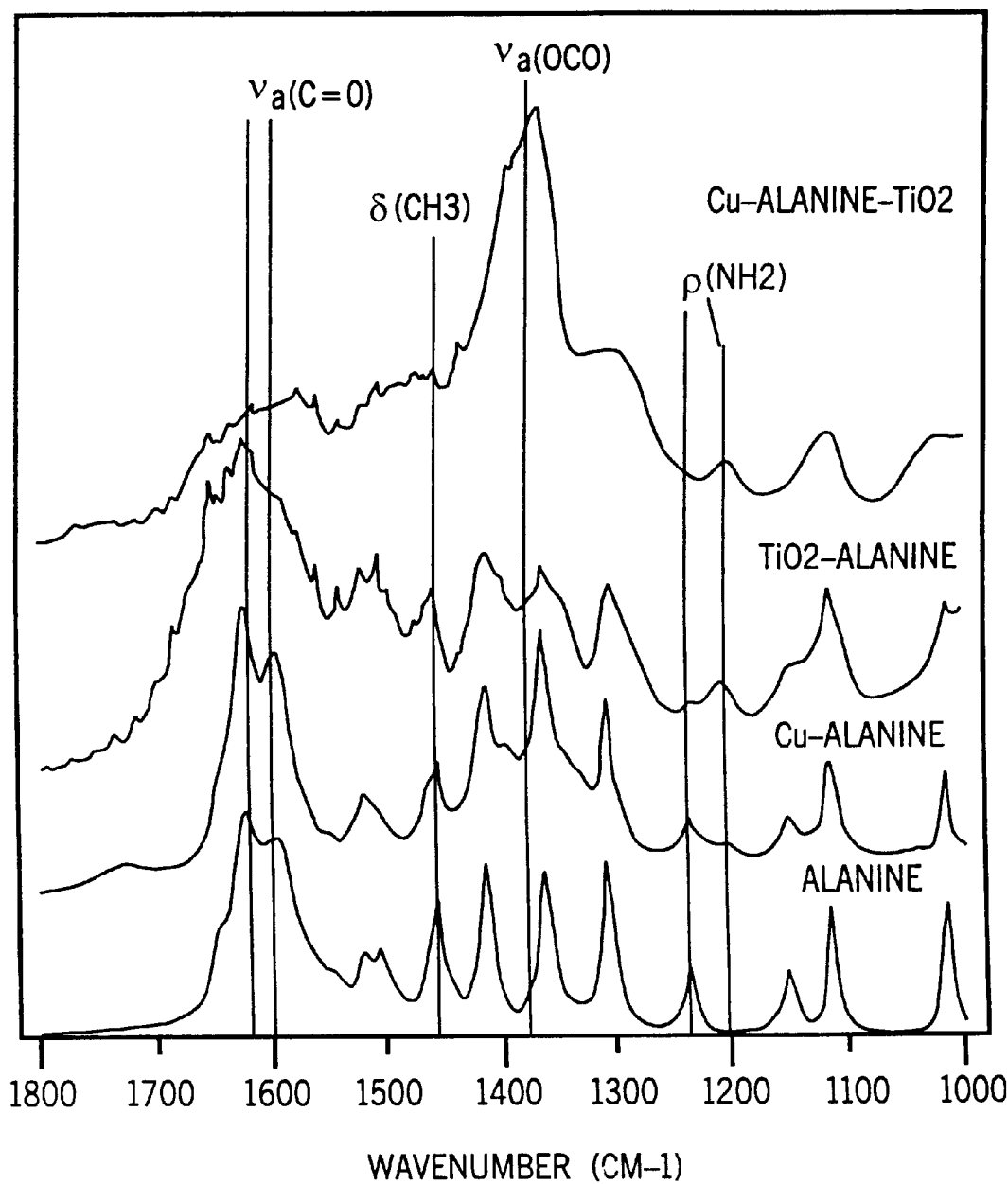
Figure 2:
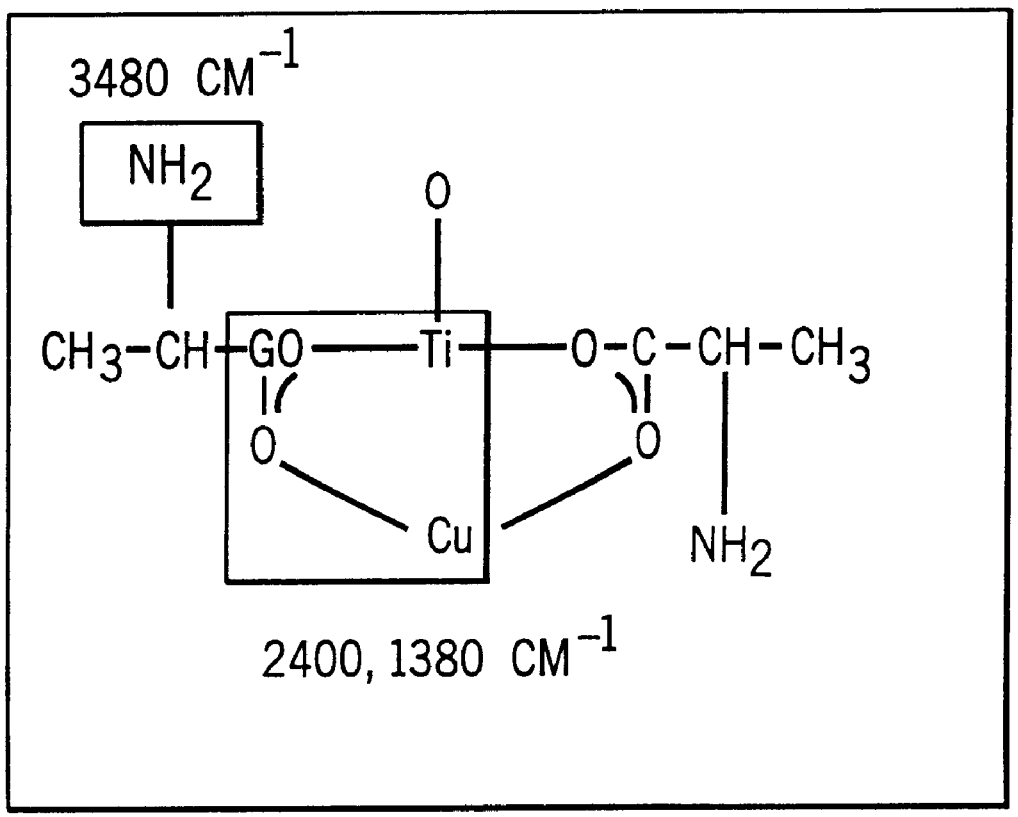
FIG. 2 shows one expected modification of surface structure of alanine in the presence of copper ions.

FIG. 1 illustrates the change in the vibration spectrum of alanine after adsorption on $TiO_2$ and binding with copper ions. The shift of the stretching vibration of the amino group toward higher energies (from 3100 $cm^{-1}$ to 3450 $cm^{-1}$) indicates vibration of a free $NH_2$, group, i.e., release of the amino group from hydrogen bonding upon binding to the colloid surface. In the case of the chelation of alanine to copper ions in the absence of $TiO_2$, the band shifts less (from 3100 $cm^{-1}$ to 3230 $cm^{-1}$) indicating binding of the amino group to copper ions through the nitrogen lone pair of electrons. Binding of the copper to surface modified $TiO_2$ particles induces the disappearance of the stretching vibration of the carboxyl group at 1600 $cm^{-1}$ and concomitant appearance of a new band for the symmetrical stretching vibration in the wavelength range assigned to the C—O bond order of 1.5. These results suggest that the carboxyl group of alanine bridges surface titanium and copper ions in a chelated symmetrical structure that enhances the symmetrical stretching. A possible structure that agrees with infra red (IR) spectra is shown in FIG. 2. It should be noted that the appearance of this band for symmetrical stretching was not observed in the binding of copper ions when the surface modifying agent was acetate ion. These results indicate that addition of electron donating groups adjacent to the carboxyl group, such as amines, enhances the degree of coupling with the titanium surface atoms and the symmetrical stretching adding the stability to the copper(II) complex at the $TiO_2$ surface. Similar changes in the vibration spectra were found also when glycine was used as the surface modifier, suggesting the same mechanism of passive sorption.

Addition of the phosphonic group to alanine (APPA) did not enhance adsorption of copper ions on the $TiO_2$ surface as much as expected. While still causing adsorption, the amount of copper bound to the $TiO_2$ surface was reduced upon binding of the alanine - copper complex through the phosphono group. In this case, IR spectroscopy suggests that copper is bound with both the carboxyl and amino groups, while the phosphono group binds to surface Ti atoms. The stretching vibrations for the amino and carboxyl groups were very similar to the spectrum of the copper alanine complex; while the stretching vibration of the phosphono group was shifted to a lower wavenumber region, from 1250 $cm^{-1}$ to 1210 $cm^{-1}$, upon binding to $TiO_2$ surface.

Figure 3:
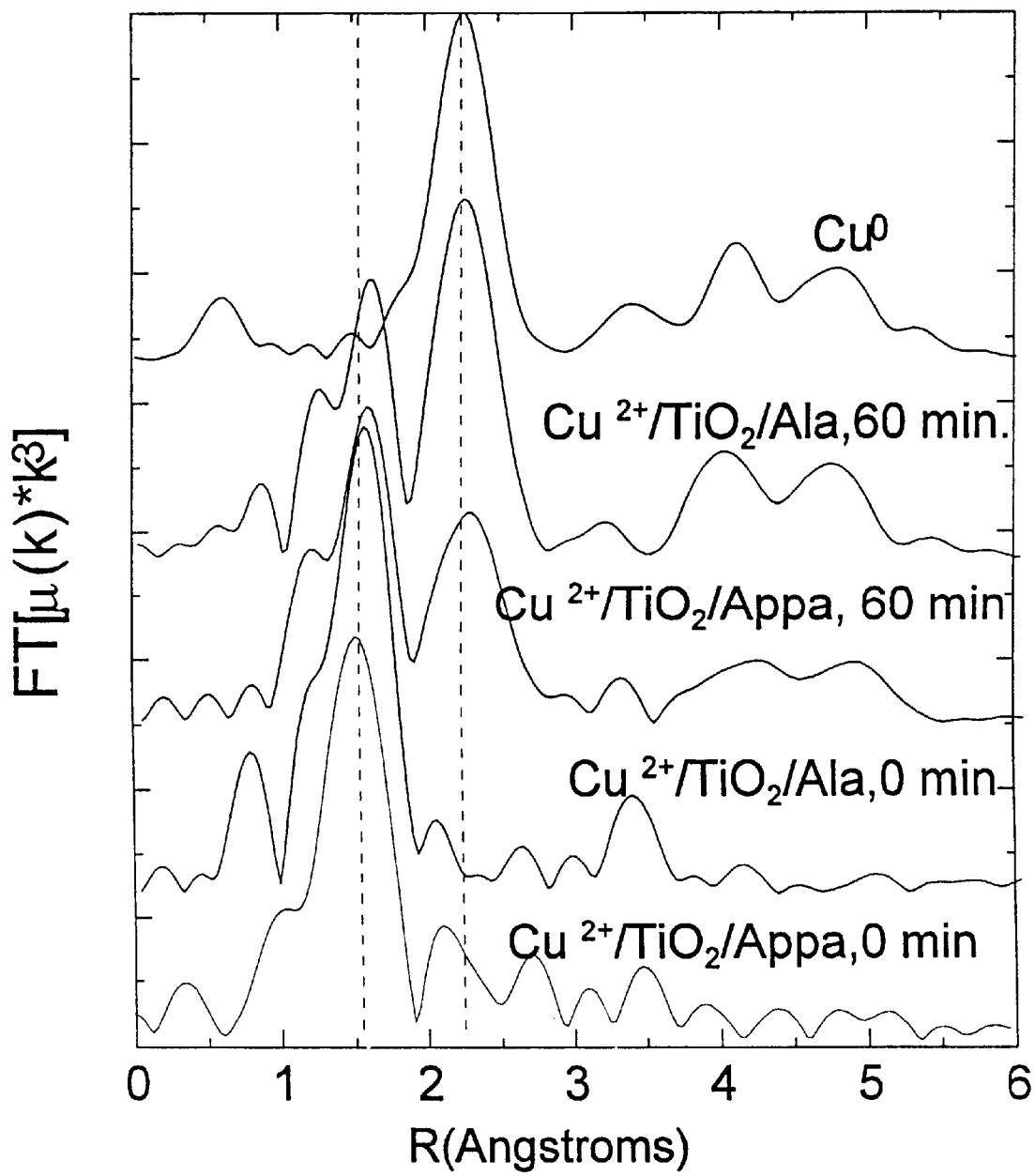
FIG. 3 shows FT-XAFS of Cu formed during photoreduction of $Cu^{2+}$ in alanine and APPA modified $TiO_2$ colloids.

A series of XAFS spectra were taken at the Cu K-edge for copper ions bound to the $TiO_2$ surface through the alanine complex or other surface modifiers. We have found significant photoreduction of Cu>when adsorbed copper ions were bridged to $TiO_2$ particles through the alanine modifier (see FIG. 3), whereas no reduction was observed when copper ions were adsorbed in the presence of acetate. Alanine and acetate have a similar oxidation potential of E=+2.2 V vs. NHE. Before illumination the FT-XAFS spectrum is dominated by the peak whose position indicates a bond distance between 1 and 2 A as a consequence of backscattering from O or N atoms of alanine, and a minor peak for a bond distance of 3.5 A originating from backscattering of O from water that solvates copper ions in a second shell. During illumination the appearance of a new peak characteristic of the Cu—Cu distance in metallic copper (between 2 and 2.5 A) was observed. Without limiting the scope of this invention, it is believed that these observations indicate adsorption of alanine in the presence of copper is responsible for photoreduction of copper ions to metallic copper which is observed despite the poor electron donating properties of alanine. The electron donating character of the amino group adjacent to the carboxyl group enhances the degree of coupling with the surface Ti atoms allowing easier electron transfer from $TiO_2$ to the copper(II) complex at the surface. Surface modification with glycine resulted in slower reduction of copper ions, consistent with the observed negative shift of the copper reduction potential after complexation with glycine. Addition of the phosphonic group to alanine (APPA) decreased the rate of copper reduction, although the reduction potential of the Cu>/A.PPA complex is slightly more positive than the reduction potential of the $Cu^{2+}$alanine complex. We believe that the non-cooperative linking of the metals through the phosphono group, as well as increased distance of copper ions from the colloid surface, is responsible for the decreased rate of copper reduction. It should be noted that a characteristic Cu—Cu distance in metallic copper was observed following illumination.

Figure 4:
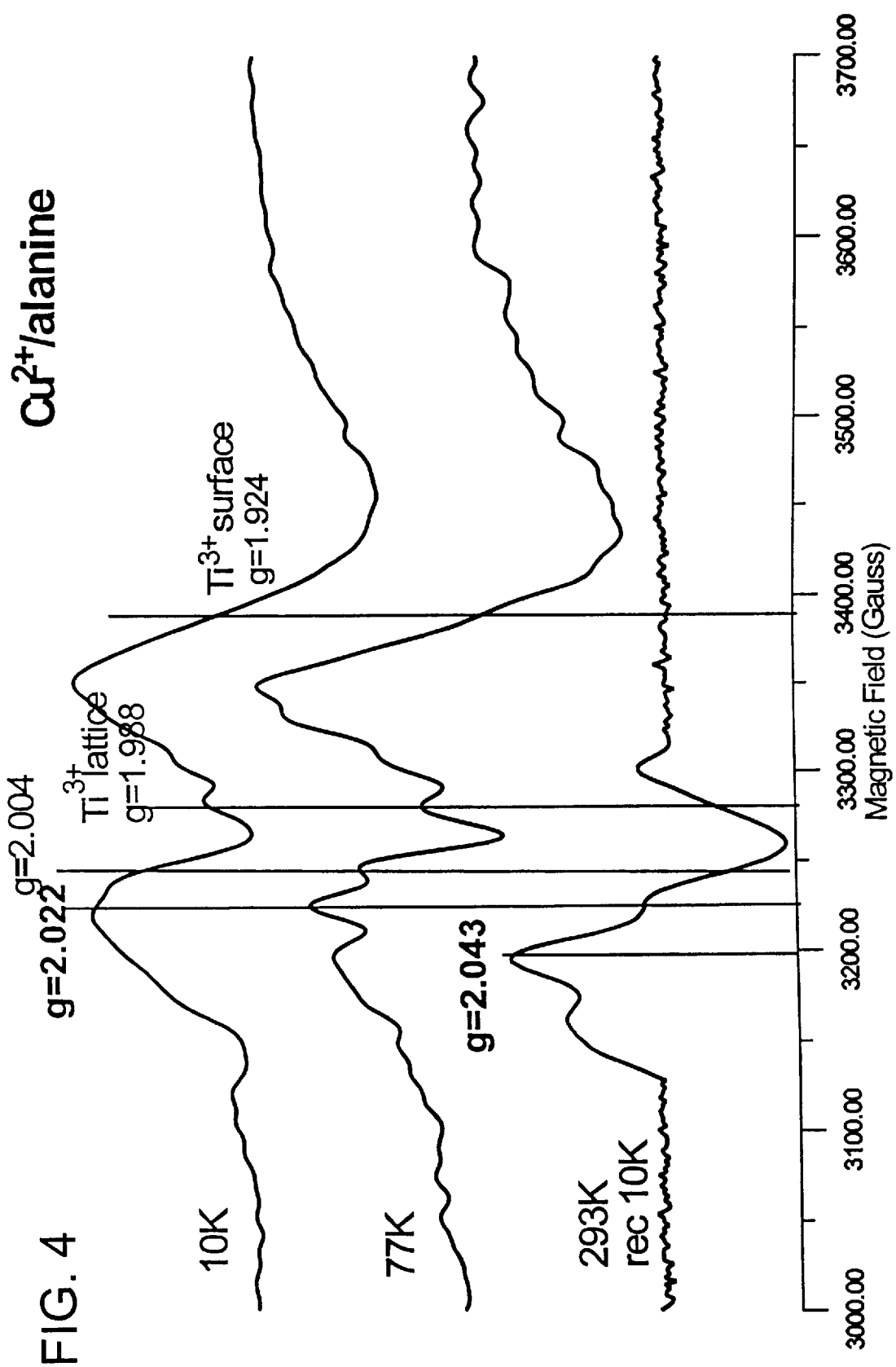
FIG. 4 shows difference EPR spectra of $TiO_2$ colloids modified with alanine in the presence of copper ions illuminated with 355 nm laser at 10K and recorded at different temperatures.
Figure 5:
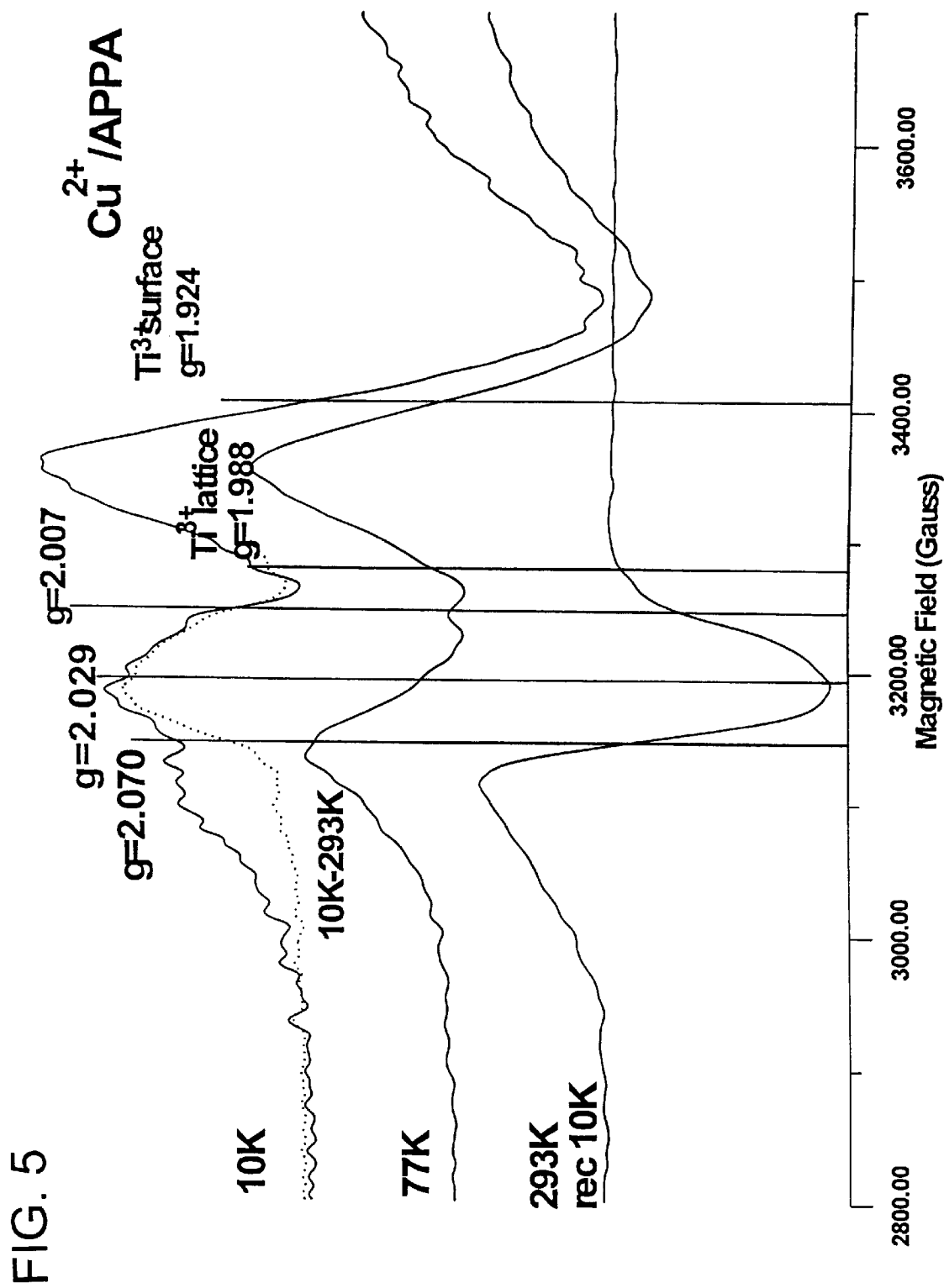
FIG. 5 shows difference EPR spectra of $TiO_2$ colloids modified with APPA in the presence of copper ions illuminated with 355 nm laser at 10K and recorded at different temperatures.

The mechanism of charge separation that leads to reduction of copper ions was investigated by EPR spectroscopy (see FIG. 4). Illumination with light (355 nm) of the alanine modified $TiO_2$ colloids at 10 K in the presence of copper ions leads to the formation of(i) two signals in the region g<2.00 associated with trapped electrons and (ii) two signals in the region g>2.00 at low temperatures that can be associated with trapped holes. These two signals for trapped holes, with g-factors 2.004 and 2.022, were previously observed when the $TiO_2$ surface was modified with S-methyl cysteine and was associated with the holes trapped on the carboxyl groups. At elevated temperatures the holes are transferred within the surface modifier molecule, and this signal transforms into the one signal centered around g~2.043. However, we were not yet able to identify this signal appearing at room temperature. The g-factor for the lattice trapped electrons as Ti(III) centers was found to be g=1.988, whereas the g-factor for the surface centers was found to be =1.924 in the unmodified $TiO_2$, colloids where all the surface bonds are coordinated with OH groups. These trapping sites are not significantly affected by adsorption of alanine, probably because of the low surface coverage of alanine. However, in the presence of copper, heating of the sample to room temperature resulted in disappearance of the signal for trapped electrons. These were the same conditions in which the reduction of copper ions was observed by XAS. We have examined the effect of different modifiers on the charge separation distance. In the case of APPA, we speculate that the hole is primarily trapped as a symmetrical oxygen centered radical on the $TiO_2$ surface ($g_x=g_y=g_z=$ 2.007—see FIG. 5). Upon raising the temperature to 77K, the surface trapped radical possibly is transformed to an oxygen centered radical on the phosphono group. The same radical was previously obtained by illumination of semiconductor colloids stabilized with trioctyl phosphine oxide. These results indicate weaker coupling of the phosphono groups to surface titanium atoms compared to carboxyl groups from alanine.

Figure 6:
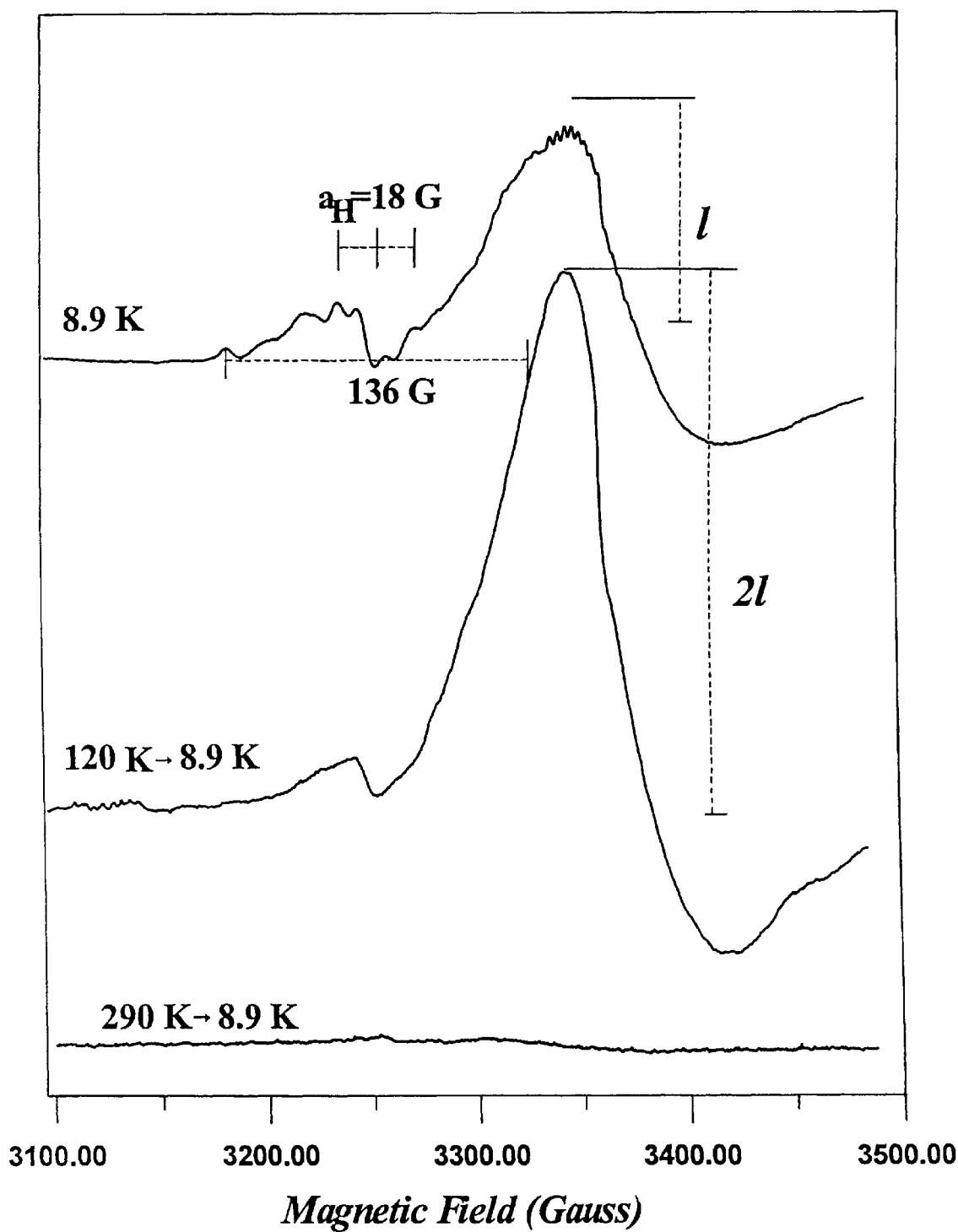
FIG. 6 shows difference EPR spectra of $TiO_2$ colloids modified with alanine in the presence of methanol and metal ions illuminated with 355 nm laser at 77K and recorded at different temperatures.
Figure 7A:
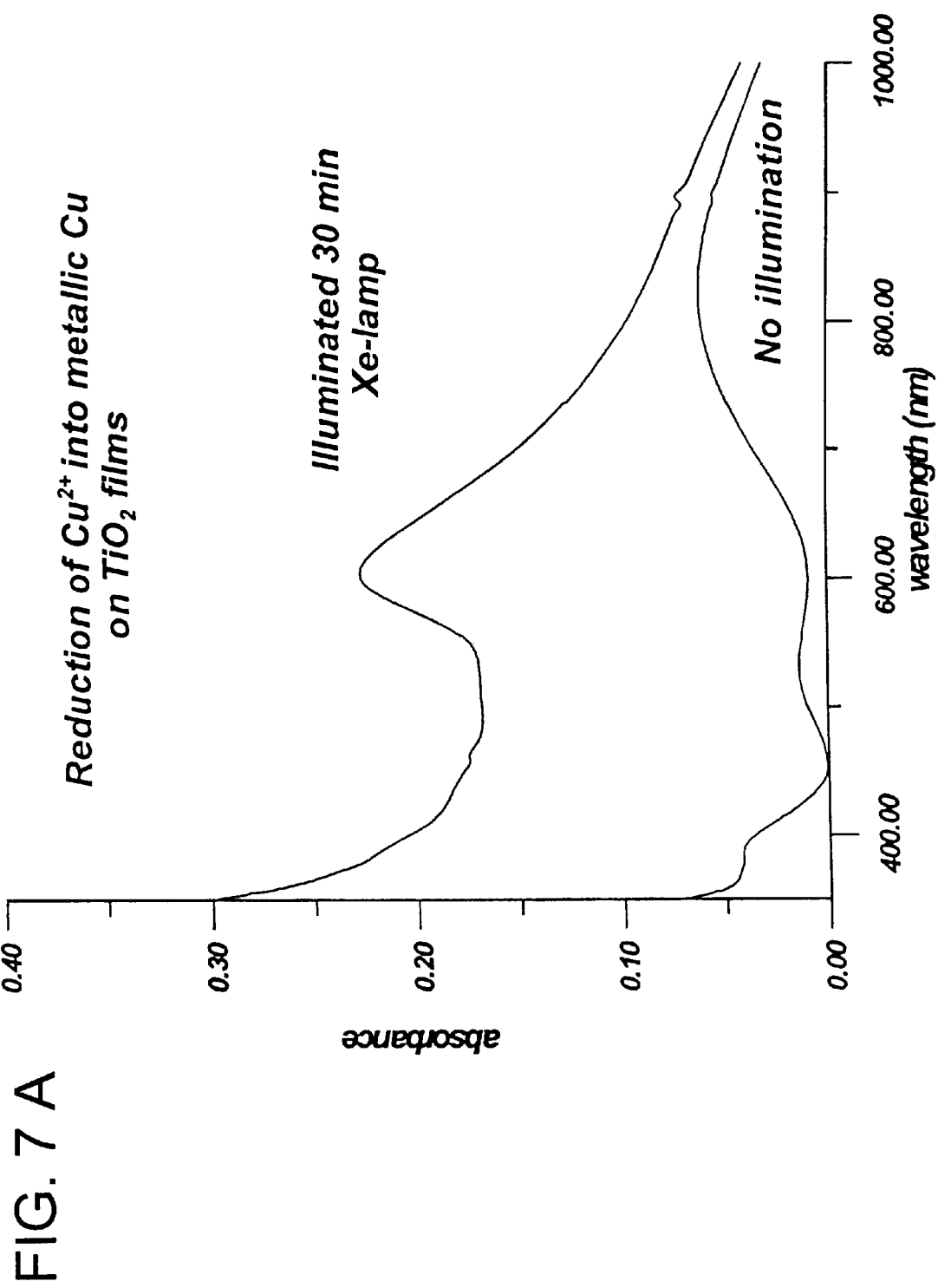
FIG. 7 shows absorption spectra of photodeposited metallic copper and silver on $TiO_2$ nanocrystalline films.
Figure 7B:
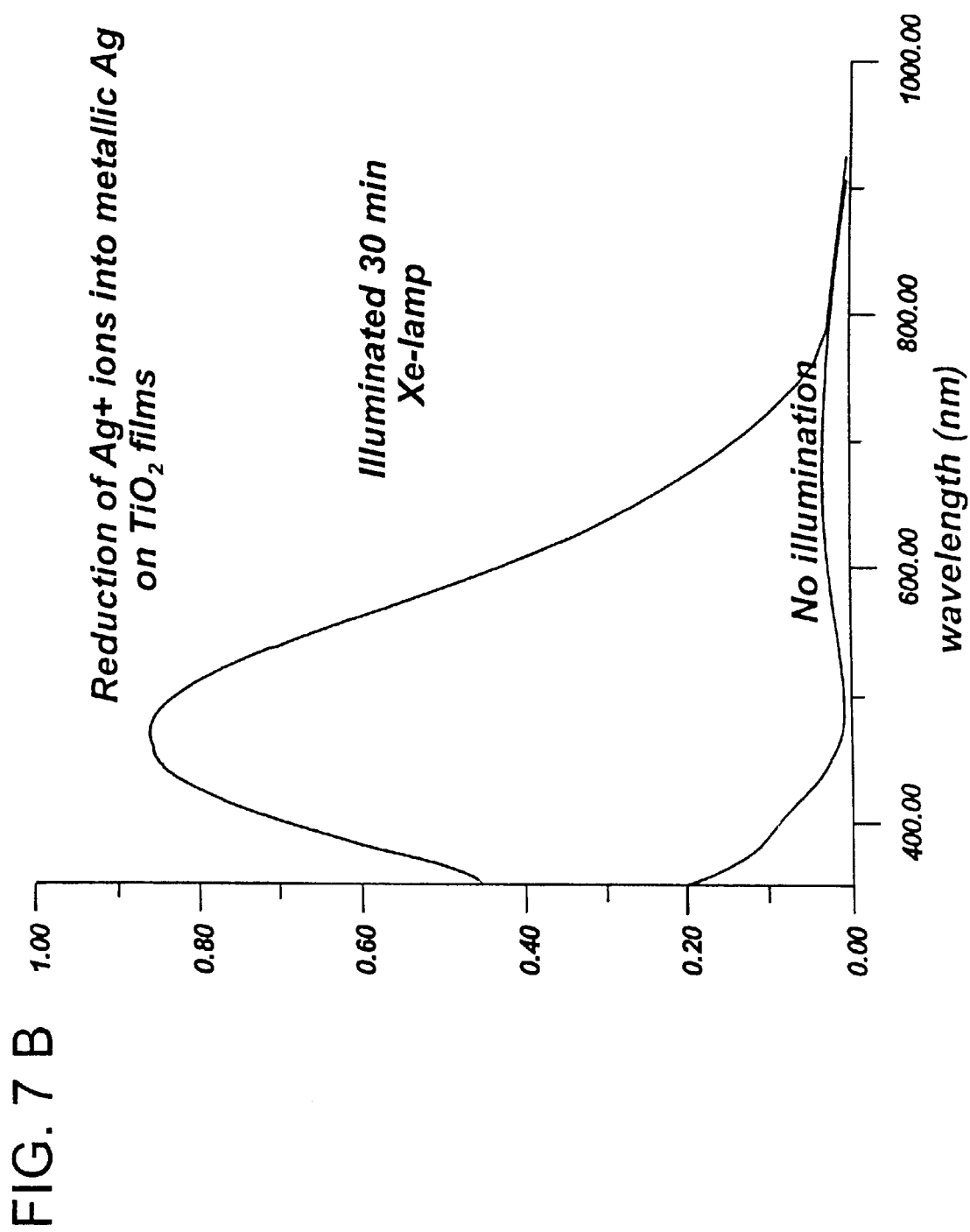

In order to protect the surface modifier (for example, alanine) against oxidation, a sacrificial electron donor, which can also enhance the yield of reduction of copper, was introduced into solution. We investigated the alanine-modified system in the presence of methanol. Methanol is a known current doubling agent and can be easily oxidized by photogenerated holes. In the presence of methanol, the EPR signal of the $Cu^{2-}$/alanine modified $TiO_2$ colloid at 8.9 K (see FIG. 6) is composed of a partially obscured set of triplet lines with separation of about 18 G, and a set of doublet lines with 136 G separation (arising from the methanol radical ($CH_2O(H)$) and formyl radical (CHO), respectively). The signals associated with trapped electrons are those due to Ti(III) in the bulk lattice (g=1.988), and of Ti(III) at the surface with g=1.924. Thus, the holes are transferred to adsorbed methanol which is oxidized to the methanol radical instead of oxidizing alanine. The large negative potential of the methanol radical induces electron injection into colloidal $TiO_2$ at 120 K with formation of surface trapped electrons and formaldehyde. Consequently, the yield of electrons is doubled (see FIG. 6). This spectrum disappears at room temperature indicating the reduction of copper ions that were observed in XAS measurements. Without limiting the scope of the invention, the following alternative mechanism is proposed. Based upon our understanding of the mechanism of semiconductor assisted photoreduction of copper described above, an alternative is a photoelectrochemical method for deposition of conducting patterns on surface modified nanocrystalline $TiO_2$, films. Nanocrystalline films that are deposited on glass supports have large surface area and after-surface modifications with alanine readily adsorb copper and silver ions on $TiO_2$ surfaces. Following illumination with ultraviolet light, photogenerated electrons are transferred to the chelated metal ions adsorbed to the surface, and as a consequence, pattern structures of metallic copper or silver can be generated on the nanometer range length scale. Photogenerated holes on the other hand can either oxidize excess alanine adsorbed to surface titanium atoms or react with adsorbed methanol hydrogen bonded to the $TiO_2$ surface. The intensive passive sorption and the ability to photoreduce metal ions, allows for deposition of metallic patterns on dry supported nanocrystalline films. Illumination of these dry samples results in the regional reduction of ions to their metallic forms controlled either by interposing a mask between the radiation source and supported modified films or by direct laser writing (see FIG. 7). The grain size of the photodeposited metallic copper and silver is in the nanosize regime as well as their support, $TiO_2$ particles, displaying the characteristic absorption spectra of metal colloids in the nanometer length regime with corresponding plasmon bands at 610 nm and 450 nm respectively (see FIG. 7).

The following non-limiting examples illustrate aspects of the invention.

EXAMPLE I

All chemicals used to make colloidal, nanoparticulates were reagent grade and used without further purification (Aldrich or Baker suppliers). Triply distilled water was used. The pH of solution was adjusted to pH 3.5 with NaOH or HCl and oxygen was removed by bubbling with argon or nitrogen.

$TiO_2$ colloid preparation is well known in the art. $TiO_2$ particles with diameters of about 45 A were prepared by dropwise addition of titanium (IV) chloride to cooled water. The temperature and rate of component mixing of reactants were controlled by an apparatus developed for automatic colloid preparation. A multi-port adjustable-temperature liquid nitrogen cooled gas flow system was used to control the temperature of $TiCl_4$ prior to addition to water and control the temperature of the reaction vessel. A peristaltic pump with variable size outlet ports was used to control drop size as well as drop rate of $TiCl_4$. Following $TiCl_4$ hydrolysis, the solution was dialyzed against distilled water at 4° C. Particle size was determined by a transmission electron microscope JOEL CXII. The concentration of $TiO_2$ (0.1–0.6 M) was determined from the concentration of the peroxide complex obtained after dissolving the colloid in concentrated $H_2SO_4$.

The nanocrystalline $TiO_2$, films were prepared on the glass supports by dip coating technique by using $TiO_2$ (45 A) colloids as a precursor. After dipping the glass slides in the concentrated $TiO_2$, colloidal solution (0.12 M), the samples were dried at elevated temperature (150° C.) for 30 min. The nanocrystalline $TiO_2$ films having different thicknesses were prepared repeating the above mentioned procedure a different number of times (typically, number of depositions varied from 3 to 7).

The surface modification of nanocrystalline $TiO_2$, films was accomplished in dark by immersion of the samples in water solution containing 0.1 M alanine and 0.05 M silver or copper ions in the form of nitrate for >24 h. After that the samples were thoroughly rinsed with distilled water and dried in a stream of nitrogen.

A 200 W UV-Xe lamp (Orion Corp) was employed for steady state illumination for photocatalytic steps. Uv-vis absorption spectra were recorded on a Shimadzu MPS-2000 instrument.

EXAMPLE II

The photocatalytic ability of dry nanocrystalline $TiO_2$ films surface modified with alanine was tested in the one electron transfer process with silver ions, whose reduction potential is 0.799 V, vs. NHE. The illumination of dried samples, almost instantaneously led to the formation of metallic silver. The broad absorption spectrum of photocatalytically deposited metallic silver on nanocrystalline $TiO_2$ film surface modified with alanine is presented in FIG. 8, curve a. A similar approach was used for preparation of surface enhanced Raman scattering active silver films. In these studies silver films were generated taking advantage of photo-induced reduction of $Ag^+$ions from solution which also contained sacrificial formate ions over $TiO_2$ films prepared by spin-coating sol-gel onto a glass surface.

Figure 8:
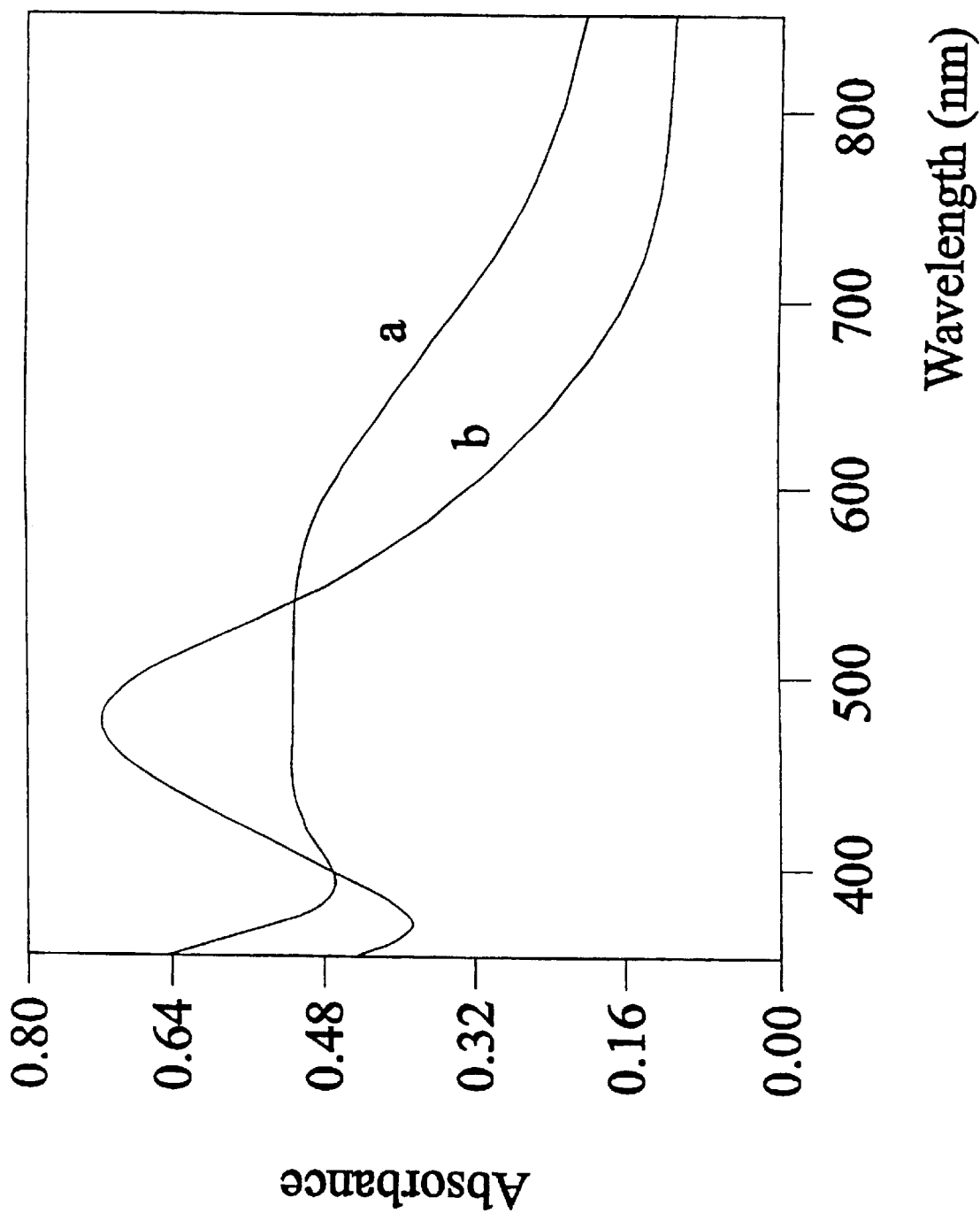
FIG. 8 shows absorption spectra of photodeposited metallic silver (illumination time 3 min) on nanocrystalline $TiO_2$ film surface (a) modified with alanine, and (b) after chemical treatment with $HNO_3$.

After the photoreduction of silver ions, the chemical treatment with 0.1 M $HNO_3$ (15 min) induced significant changes of absorption spectra of deposited metallic silver films (see curve b in FIG. 8). Upon treatment with $HNO_3$, shifts occurred towards shorter wavelength, and narrowing and increase of intensity of broad surface plasmon absorption band can be noticed (compare curves a and b in FIG. 8).

Figure 9:
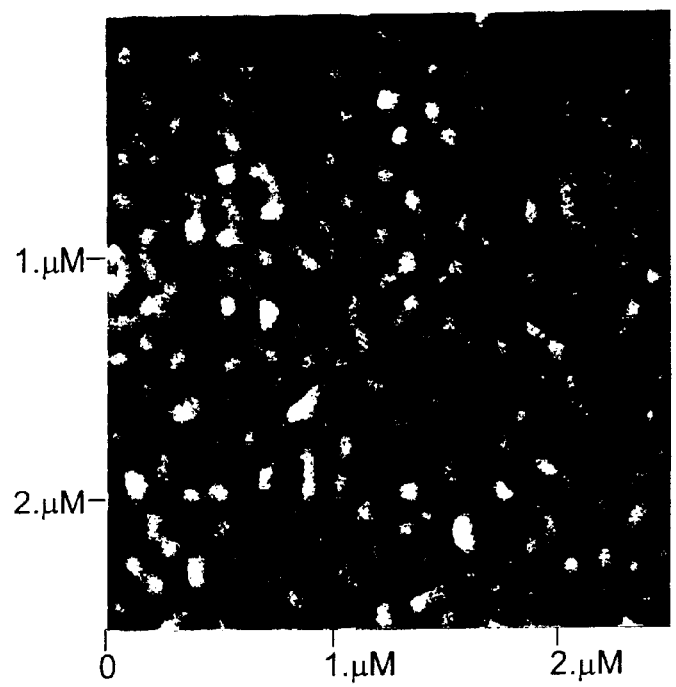
FIG. 9A shows SFM images of as-prepared and FIG. 9B of chemically-treated silver films, as well as corresponding particle size distributions below each image.
Figure 9:
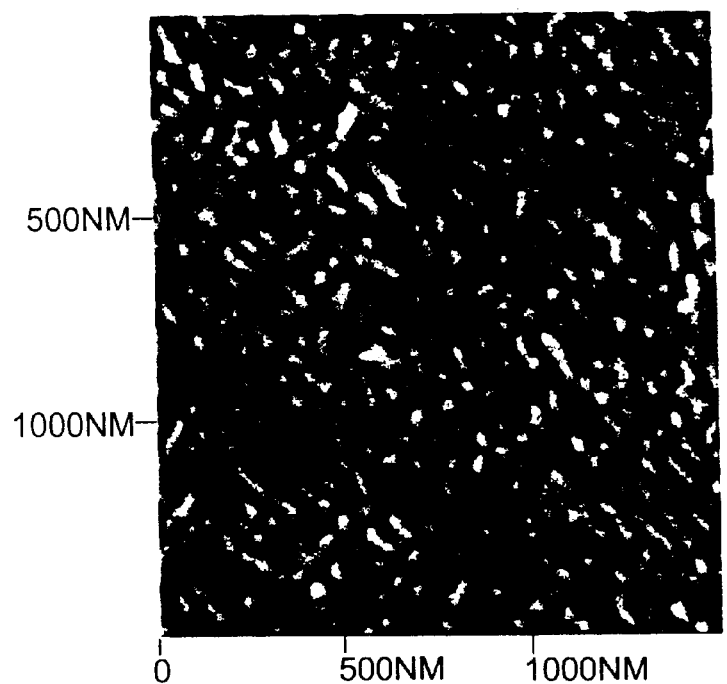
Figure 9:
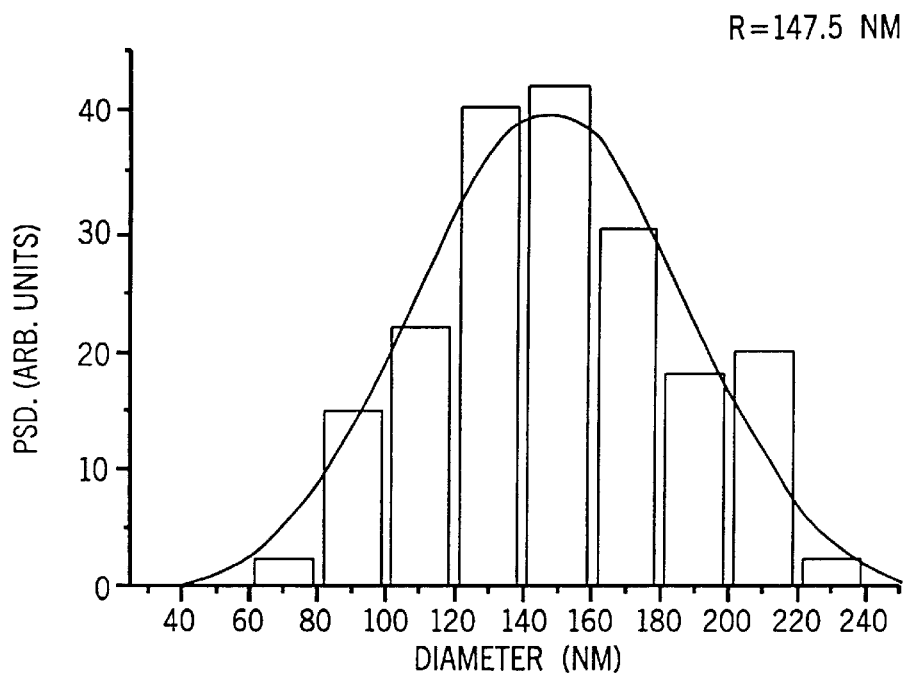
Figure 9:
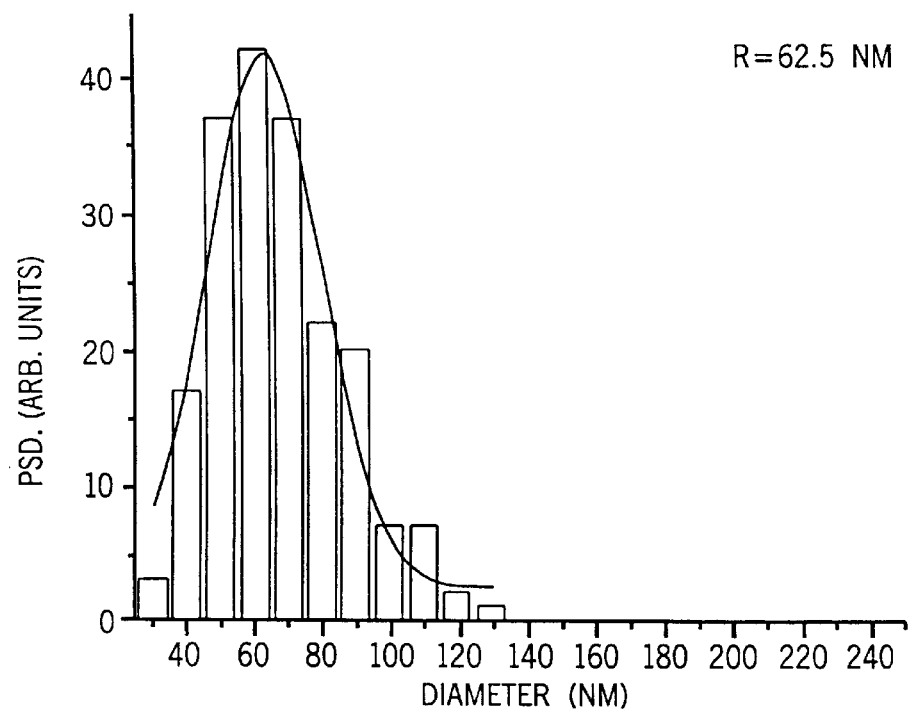

In order to correlate optical spectra with topography of silver films SFM measurements were performed. The SFM images in a two-dimensional representation of as-prepared and chemically-treated silver films as well as the corresponding size distributions of silver grains are shown in FIGS. 9A and 9B. About 40 areas were scanned at different positions on four as-prepared and chemically-treated silver film samples, yielding comparable results. Significant decrease of the mean diameter of silver grains from 145 to 65 nm was observed upon treatment with mineral acid of photochemically prepared silver films. Also, significantly narrower size distribution can be noticed in chemically-treated samples. Similar changes in morphology of silver films were induced by thermal annealing and laser irradiation.

As mentioned above, the optical absorption is attributed to plasmon resonances excited within the silver grains. The size distribution of the different grains determines the position and width of the absorption peak. The shift of the absorption to shorter wavelengths due to chemical treatment with $HNO_3$ can be qualitatively explained by the observed decrease of the average size of silver grains, while reduction in the width of the absorption peak is due to a narrower size distribution. Using the data of the grain size distribution obtained by SFM on as-prepared and chemically-treated samples, optical extinction spectra were calculated, which may be compared with the experimental data. The formalism used for the simulation of the absorption spectra is based on conventional methodologies for spherical metal colloids. Spectra were generated as a weighted superposition of subspectra calculated for each particle class, assuming no interaction between the individual particles. The extinction spectra of as-prepared and chemically-treated silver films calculated within this model are in reasonable good agreement with the experiment. The differences in short wavelength region between calculated and experimental spectra are due to absorption of $TiO_2$ films, while slight differences in wavelength region approaching IR can be explained by the fact that eccentricity of silver grains was not taken into account.

While preferred embodiments of the invention have been shown and described, it will be clear to those skilled in the art that various changes and modifications can be made without departing from the invention in its broader aspects as set forth in the claims provided hereinafter.

What is claimed is:

1. An article of manufacture, comprising:
   a semiconductor base comprised of nanoparticles;
   a modifier disposed on said semiconductor base, said modifier capable of electron hole scavenging and chelation of metal ions; and
   metal ions disposed on at least one of said semiconductor and said modifier.

2. The article of manufacture of claim 1 wherein said modifier is selected from the group consisting of alanine, aminophosphoric acid, glycine and lucine.

3. The article of manufacture of claim 1 wherein said semiconductor is selected from the group consisting of $TiO_2$, $VO_2$ and $WO_2$.

4. The article of manufacture of claim 1 wherein said metal ions are selected from the group consisting of copper, silver and gold.

5. The article of manufacture of claim 1 wherein said modifier comprise a phosphono, carboxyl or amino functionality.

6. An article of manufacture, comprising:
   a semiconductor base layer comprised of nanoparticles said semiconductor base having a band gap wherein the semiconductor base generates electron hole pairs when irradiated with energy greater than the band gap of the semiconductor base; and
   a layer of conductive metal deposited on the semiconductor base layer.

7. The article of manufacture of claim 6 further comprising a support layer supporting said semiconductor base layer.

8. The article of manufacture of claim 6 wherein the article of manufacture comprises a complementary metal oxide semiconductor.

9. The article of manufacture of claim 6 wherein the particle size of the nanoparticles is in the range of 20 to 70 angstroms.

10. The article of manufacture of claim 9 wherein the nanoparticles are essentially uniform in size.

11. The article of manufacture of claim 9 wherein the nanoparticles have a particle size of 45 angstroms.

12. The article of manufacture of claim 6 wherein the semiconductor is selected from the group consisting of titanium dioxide, tungsten dioxide, vanadium dioxide, and doped compositions of titanium dioxide, tungsten dioxide and vanadium dioxide.

13. The article of manufacture of claim 6 wherein the conductive metal is selected from the group consisting of copper, silver and gold.

14. The article of manufacture of claim 6 wherein the layer of conductive metal forms an electronic component selected from the group consisting of conductor interconnects, capacitors, and inductors.

15. The article of manufacture of claim 14 wherein the dimensions of the electronic component are less than about 100 to 200 nanometers.

* * * * *

UNITED STATES PATENT AND TRADEMARK OFFICE
CERTIFICATE OF CORRECTION

PATENT NO. : 6,410,935 B1  Page 1 of 1
DATED : June 25, 2002
INVENTOR(S) : Rajh et al.

It is certified that error appears in the above-identified patent and that said Letters Patent is hereby corrected as shown below:

<u>Column 4,</u>
Line 54, "films" should be -- film --.

<u>Column 6,</u>
Line 29, "A.PPA" should be -- APPA --.
Line 31, "$Cu^{2+}$ alanine" should be -- $Cu^{2+}$/alanine --.
Line 55, "=.1.924" should be -- g=1.924 --.
Line 62, "XAS" should be -- XAFS --.

<u>Column 7,</u>
Line 14, "$Cu^{2-}$" should be -- $Cu^{2+}$ --.
Line 30, "XAS" should be -- XAFS --.

<u>Column 8,</u>
Line 17, "$TiO_{2,}$ films" should be -- $TiO_2$ films --.
Line 20, "$TiO_{2,}$ colloidal" should be -- $TiO_2$ colloidal --.

Signed and Sealed this

Thirty-first Day of December, 2002

JAMES E. ROGAN
*Director of the United States Patent and Trademark Office*

UNITED STATES PATENT AND TRADEMARK OFFICE
CERTIFICATE OF CORRECTION

PATENT NO.    : 6,410,935 B1
DATED         : June 25, 2002
INVENTOR(S)   : Rajh et al.

It is certified that error appears in the above-identified patent and that said Letters Patent is hereby corrected as shown below:

Title page,
Item [73], "Argonne National Laboratory" is deleted and
-- The University of Chicago -- is inserted.

Signed and Sealed this

Fifteenth Day of April, 2003

JAMES E. ROGAN
*Director of the United States Patent and Trademark Office*